(12) United States Patent
Yip

(10) Patent No.: US 6,882,256 B1
(45) Date of Patent: Apr. 19, 2005

(54) ANCHORLESS ELECTROSTATICALLY ACTIVATED MICRO ELECTROMECHANICAL SYSTEM SWITCH

(75) Inventor: David Yip, La Mirada, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 7 days.

(21) Appl. No.: 10/465,555

(22) Filed: Jun. 20, 2003

(51) Int. Cl.[7] .............................. H01P 1/10; H81B 7/02; H81B 7/04
(52) U.S. Cl. ...................... 333/262; 333/105; 200/181
(58) Field of Search ............................. 333/101, 262; 200/181

(56) References Cited

U.S. PATENT DOCUMENTS

| | | | |
|---|---|---|---|
| 6,143,997 A | 11/2000 | Feng et al. | 200/181 |
| 6,218,911 B1 | 4/2001 | Kong et al. | 333/101 |
| 6,294,847 B1 | 9/2001 | De Los Santos | 307/125 |
| 6,489,857 B1 * | 12/2002 | Petrarca et al. | 333/105 |
| 6,639,488 B1 * | 10/2003 | Deligianni et al. | 333/101 |
| 2002/0136485 A1 | 9/2002 | Reed et al. | 385/18 |
| 2003/0090350 A1 | 5/2003 | Feng et al. | 335/78 |

FOREIGN PATENT DOCUMENTS

| | | | | |
|---|---|---|---|---|
| WO | WO 02/39472 | 5/2002 | .......... | H01H/59/00 |
| WO | WO 2004/046019 | 6/2004 | .......... | B81B/5/00 |

* cited by examiner

*Primary Examiner*—Robert Pascal
*Assistant Examiner*—Dean Takaoka
(74) *Attorney, Agent, or Firm*—Posz Law Group, PLC

(57) ABSTRACT

A micro electromechanical system (MEMS) switch (10) includes a substrate (12) and a stress free beam (14) disposed above the substrate (12). The stress free beam (14) is provided within first and second platforms (16, 18) to limit displacement of the stress free beam (14) in directions that are not substantially parallel to the substrate (12). A set of one or more control pads (20) is disposed in a vicinity of a first lengthwise side (22) of the stress free beam (14) for creating a potential on the first lengthwise side (22) of the stress free beam (14). The stress free beam (14) is displaceable in directions substantially parallel to the substrate (12) in accordance with the potential for providing a signal path.

17 Claims, 8 Drawing Sheets

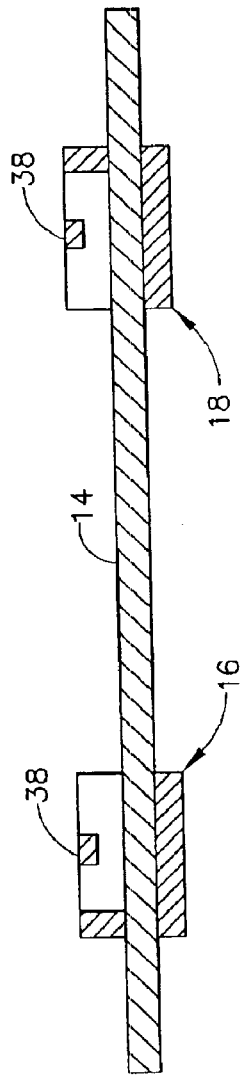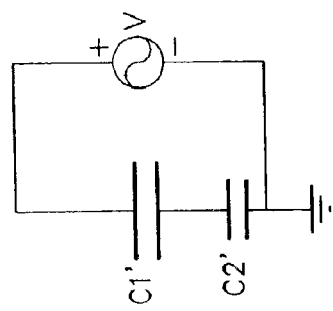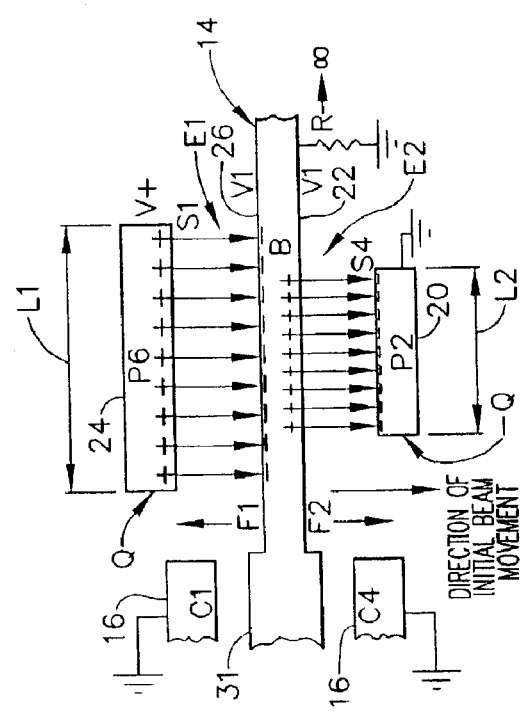

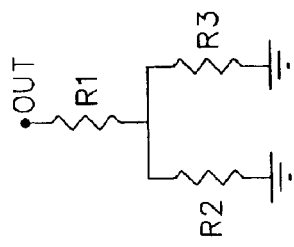
FIG. 7
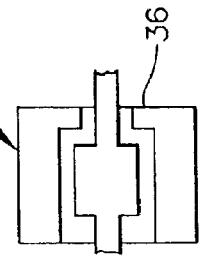
FIG. 8C
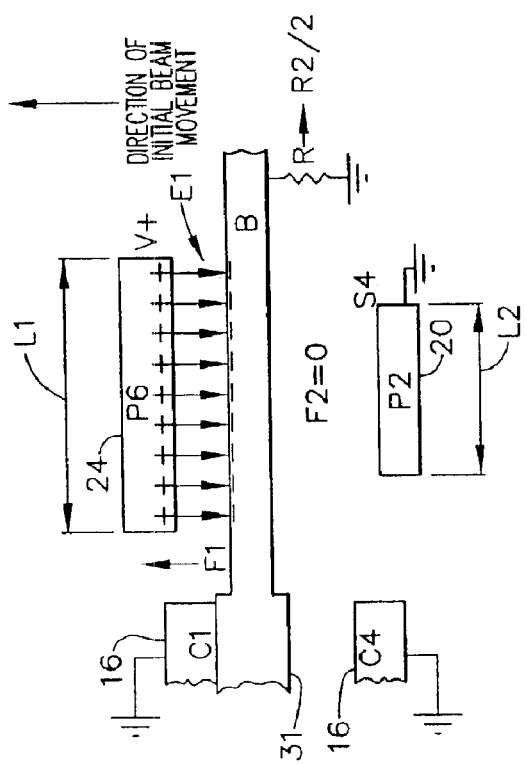
FIG. 6
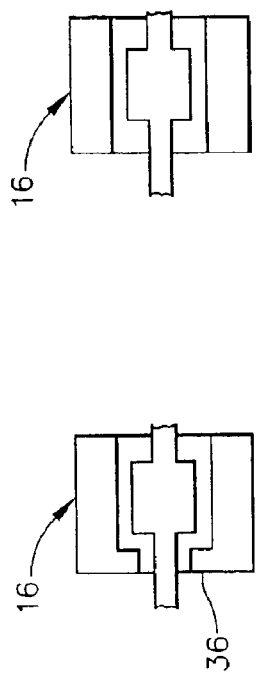
FIG. 8B
FIG. 8A

ANCHORLESS ELECTROSTATICALLY ACTIVATED MICRO ELECTROMECHANICAL SYSTEM SWITCH

FIELD OF THE INVENTION

The present invention relates generally to switches and, more specifically, to switches implemented by Micro Electromechanical System (MEMS) technology.

BACKGROUND

Micro Electromechanical System (MEMS) switches are widely used in RF communication systems such as, for example, phased array antennas, phase shifters, switchable tuning elements, and radar sensors. Generally, MEMS switches have features such as low insertion loss, low power consumption, low cost, small size, wide bandwidth operation, long lifetimes and fast switching speeds not found in conventional solid state switches (e.g., FETs or PIN diodes). Specifically, a high quality MEMS switch should ideally have as many of the following features as possible: low activation voltage, high switching speed, long operation lifetime, good isolation from the output signal during an OFF state, low contact resistance and high contact force between the contact electrodes during an ON state, little or no stiction problems at the contact area for easy separation, low power consumption during the switching between different states, little or no power consumption to maintain the switch at a certain state, low cost, ease of fabrication, and ease of switch integration with other coplanar circuitry components.

MEMS switches can be classified into several major categories based on actuation methods including electrostatic, electromagnetic, or electrothermal switches. Conventional MEMS switches that fall into one of these categories exhibit some of the above mentioned high quality MEMS switch features. However, none of the conventional switches exhibit all of the above features.

Further, with respect to electrostatic switches, these switches have the distinct advantage of zero power consumption when toggled or maintained at a given state. However, electrostatic switches also have several disadvantages such as slow switching speed (on the order of psec to msec), relatively high actuation voltage (10–80 V), stiction problems when the contact electrodes are welded together upon physical contact, relatively short lifetimes (100 million cycles for cold switching), and instability problems due to thermal and fabrication related stresses.

Accordingly, an object of the present invention is to provide an electrostatic MEMS switch that exhibits all of the above mentioned ideal switch features and that is free of the above mentioned disadvantages.

It is also an object of the present invention to fabricate such a MEMS switch by a simple process.

It is a further object of the present invention is to provide an electrostatic MEMS switch with a configuration that permits multiple throws and multiple poles.

SUMMARY OF THE INVENTION

Accordingly, the present invention provides a micro electromechanical system (MEMS) switch that includes a substrate and a stress free beam disposed above the substrate. The stress free beam is provided within first and second platforms. The first and second platforms are disposed on the substrate and limit displacement of the stress free beam in directions that are not substantially parallel to the substrate. The MEMS switch also includes a first set of one or more control pads disposed in a vicinity of a first lengthwise side of the stress free beam for creating a potential on the first lengthwise side, and a second set of one or more control pads disposed on the substrate and in the vicinity of a second lengthwise side of the stress free beam for creating a second potential on the second lengthwise side. The stress free beam is displaceable in directions substantially parallel to the substrate in accordance with a relative potential between the first and second potential for providing a signal path.

The MEMS switch may alternatively be implemented to include a primary stress free beam disposed above a substrate for controlling a flow of signals and a plurality of secondary stress free beams structurally and electrically coupled to the primary stress free beam. Each of the plurality of secondary stress free beams is preferably disposed within first, second and third platforms for limiting beam displacement in directions other than substantially parallel to the substrate. Also, each of the plurality of secondary stress free beams is displaceable in the directions substantially parallel to the substrate in response to a relative potential to accordingly displace the primary stress free beam.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 3 is a side view of the stress free beam and platforms of the exemplary MEMS switch of FIG. 2 along section line III—III.

FIG. 4 is an illustration of the initial charge distribution within the MEMS switch of FIG. 2A before the stress free beam establishes good electrical contacts with the extended sidewalls of the platforms.

FIG. 5 is an illustration of the equivalent circuit of the MEMS switch of FIG. 2A before the stress free establishes good electrical contacts with the extended sidewalls of the platforms.

FIG. 6 is an illustration of the charge distribution within the MEMS switch of FIG. 2A after the stress free beam establishes good electrical contacts with the extended sidewalls of the platforms.

FIG. 7 is an illustration of the equivalent circuit of the MEMS switch of FIG. 2A after the stress free beam establishes good electrical contacts with the extended sidewalls of the platforms.

FIGS. 8A–8C are illustrations of alternative implementations of the platforms of the MEMS switches in FIG. 1.

DESCRIPTION OF THE PREFERRED EMBODIMENTS

Figure 1:
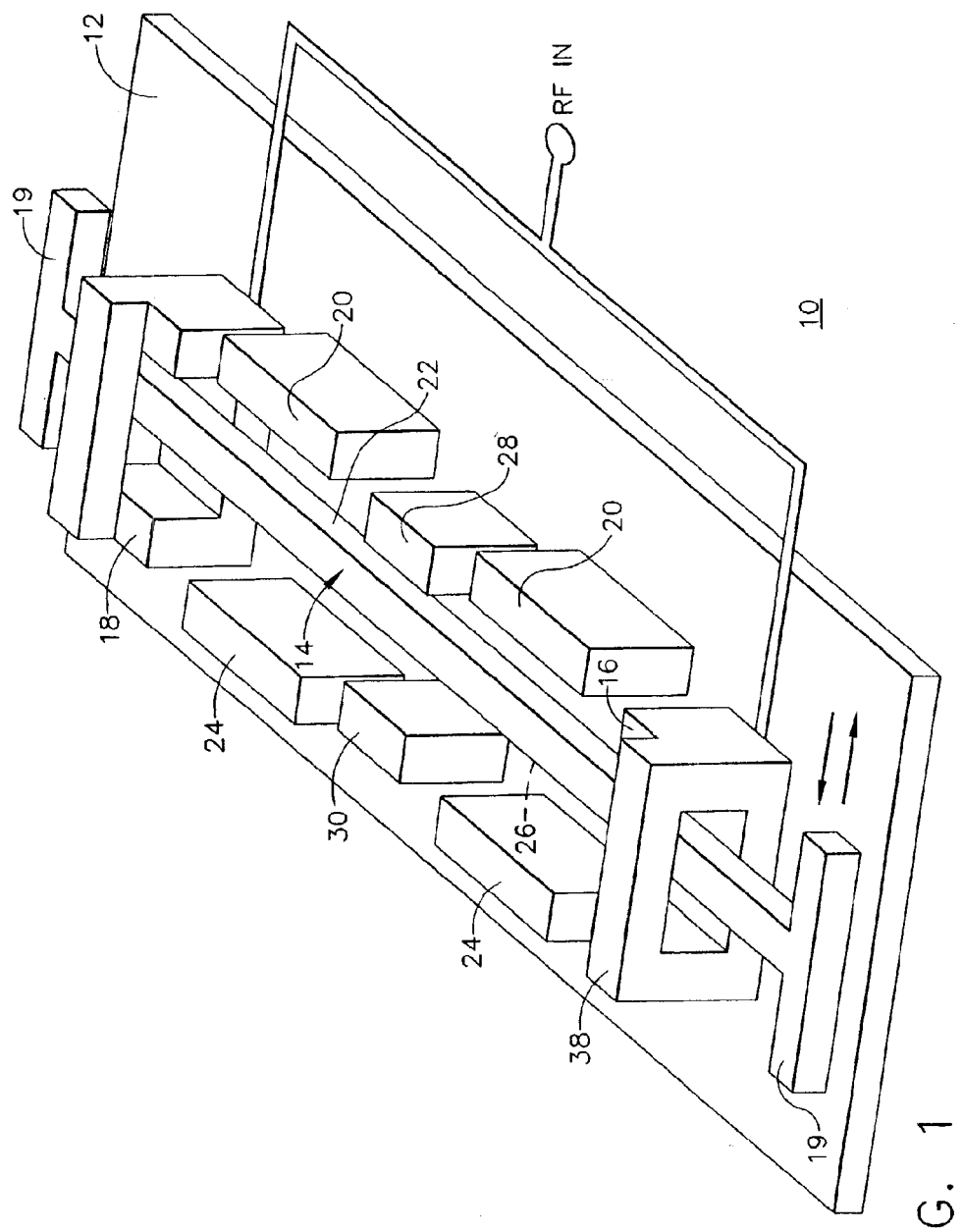
FIG. 1 is an isometric view of an exemplary MEMS switch according to a first preferred embodiment.
Figure 2A:
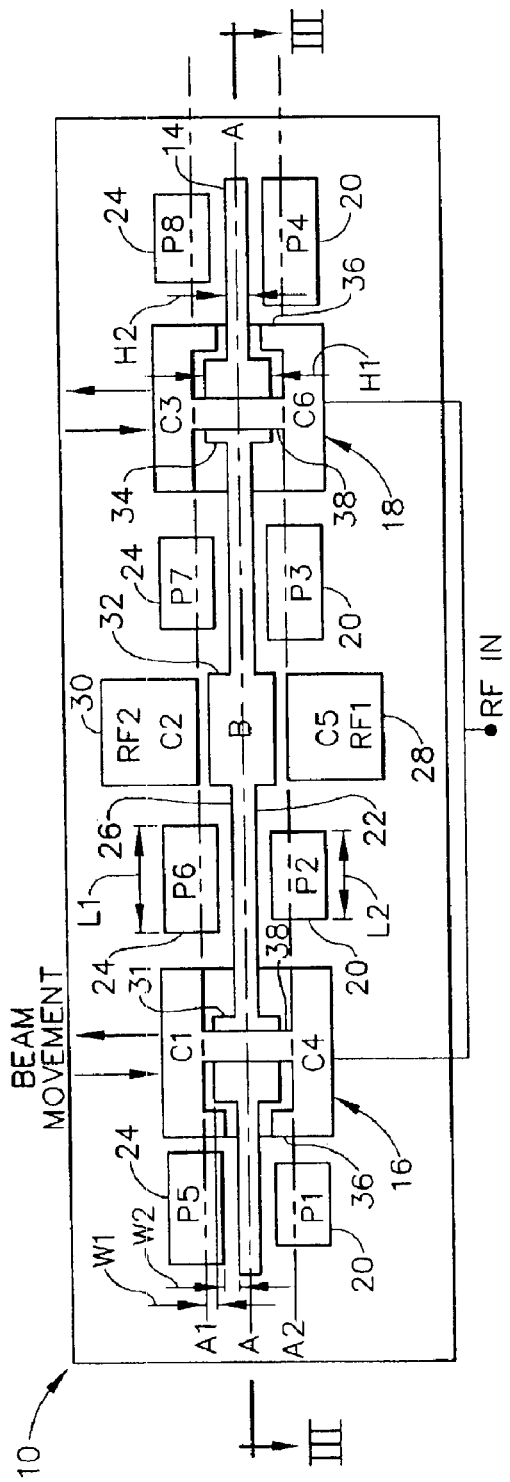
FIG. 2A is a top plan view of an exemplary MEMS switch also according to the first preferred embodiment.

Referring now to the drawings in which like numerals reference like parts, FIGS. 1–2A show an exemplary MEMS switch 10 according to a first preferred embodiment. Referring to FIG. 1, the MEMS switch 10 includes a substrate 12 such as, for example, GaAs, quartz, or lithium niobate. However, the substrate 12 may also be transparent depending on the particular application intended for the MEMS switch 10. A beam 14 (stress free beam) is disposed above the substrate 12 and is provided within a first platform 16 and a second platform 18. The first and second platforms 16, 18 are also disposed on the substrate 12. The stress free beam 14 is not anchored to the first platform 16 or the second platform 18. Hence, the beam 14 is stress free and is therefore referred to as a "stress free beam."

The stress free beam 14 is manufactured from a highly conductive material such as, for example, gold or tungsten and is displaceable in directions substantially parallel to the substrate 12 as represented by the arrows indicative of beam movement. The first and second platforms 16, 18 are for limiting displacement of the stress free beam 14 in directions that are not substantially parallel to the substrate 12 and for receiving an input signal RF IN such as, for example, an RF signal from an input source. The stress free beam 14 may also include beam stoppers 19 for constraining the stress free beam 14 within the first and second platforms 16, 18. The beam stoppers 19 are optional and may be replaced by extended width portions as shown in FIG. 2A and discussed later.

Referring to FIG. 2A, the MEMS switch 10 also includes a first set of one or more electrically conductive control pads P1–P4 (first set of control pads) 20 disposed in a vicinity of a first lengthwise side 22 of the stress free beam 14, and a second set of one or more electrically conductive control pads P5–P8 (second set of control pads) 24 disposed in a vicinity of a second lengthwise side 26 of the stress free beam 14. The first set of control pads 20 and the second set of control pads 24 respectively oppose each other. The first set of control pads 20 is for creating a first potential on the first lengthwise side 22 of the stress free beam 14, while the second set of control pads 24 is for creating a second potential on the second lengthwise side 26 of the stress free beam 14. Each of the first set and second set of control pads 20, 24 preferably includes at least two control pads as shown in FIG. 1. However, more or fewer control pads may be included. For example, referring to FIG. 2A, each of the first and second sets of control pads 20, 24 may include four control pads.

The MEMS switch 10 also includes a first electrically conductive output contact pad 28 (depicted as RF1 in FIG. 2A) disposed on the substrate 12 and in the vicinity of the first lengthwise side 22 of the stress free beam 14 and a second (or another) electrically conductive output contact pad 30 (depicted as RF2 in FIG. 2A) disposed on the substrate 12 and in the vicinity of the second lengthwise side 26 of the stress free beam 14.

Referring to FIG. 2A, the stress free beam 14 preferably has a plurality of extended width portions 31, 32, 34 within the first and second platforms 16, 18 and between the first and second output contact pads 28, 30, respectively. The extended width portions 31, 32, 34 prevent the stress free beam 14 from becoming electrically coupled to (or generally directly contacting) the first and second sets of control pads 20, 24. However, the extended width portions 31, 32, 34 are optional. The stress free beam 14 may alternatively be prevented from contacting the first and second sets of control pads 20, 24 by disposing the output contact pads 28, 30 and platform surfaces closer to the stress free beam 14 as shown in FIG. 1.

Returning to FIG. 2A, each of the first and second platforms 16, 18 preferably includes an extended sidewall 36 for restricting the horizontal displacement of the stress free beam 14 to a specific range. Each of the first and second platforms 16, 18 also preferably includes a beam latch 38 as shown in FIG. 3. The beam latch 38 is disposed across the top of platforms 16, 18 and is for substantially preventing vertical displacement of the stress free beam 14. More particularly, the beam latch 38 is used to further prevent the stress free beam 14 from disconnecting from the first and second platforms 16, 18. However, the first and second platforms 16, 18 need not include the beam latch 38 or the extended sidewall 36. For example, referring to FIGS. 8A and 8C, the first and second platforms 16, 18 may only include the extended sidewall 36. Further, referring to FIG. 8B, the first and second platforms 16, 18 may include neither the beam latch 38 nor the extended sidewall 36.

Referring back to FIG. 2A, the elements of the MEMS switch 10 are positioned so that the surfaces (depicted by C1 and C3) of the first and second platforms 16, 18 and the surface (depicted by C2) of the second output contact pad 30 are disposed on the line A1, and the surfaces (depicted by C4 and C6) of the first and second platforms 16, 18, and the surface (depicted by C5) of the first output contact pad 28 are disposed on the line A2. The first and second sets of control pads 20, 24 are also positioned in such a way that the width of a gap W2 defined between the stress free beam 14 and one of the first and second control pads 20, 24 is always greater than the width of another gap W1 defined between the extended width portions 31, 32, 34 of the stress free beam 14 and one of the first or second output contact pads 28, 30. Although not shown in FIG. 2A, the corresponding gaps defined between the surfaces of the platforms below the center line A (corresponding to section line III—III) and the surface of the first output contact pad 28 have a similar relationship. Further, the width of the first output contact pad 28 does not have to be equal to the width of the second output contact pad 30.

As will be more fully discussed below, a relative potential based on a difference between the first potential and the second potential causes the stress free beam 14 to displace laterally (substantially parallel to the substrate 12) to one of the first or second output contact pads 28, 30 and maintain contact therewith when the relative potential is greater than or equal to a threshold potential such as, for example, 10 V. The threshold potential is generally determined by the cross-sectional area of the stress free beam 14 and the distance between the stress free beam 14 and the first and second output sets of control pads 20, 24. The stress free beam 14 subsequently becomes electrically coupled to this output contact pad and thereby provides a signal path between this output contact pad, the stress free beam 14 and the first and second platforms 16, 18 when the relative potential is created between the first and second sets of control pads 20, 24.

Operation of the MEMS switch 10 of FIGS. 1–2A will be discussed more fully with respect to an exemplary implementation in which the MEMS switch 10 provides an RF signal path. The stress free beam 14 is very light weight (on the order of nN) and the adhesion force (mainly van der Waal's force) between the stress free beam 14 and the first and second platforms 16, 18 is small (less than 1 $\mu$N). Therefore, the contact force may not suffice to establish a significant electrical contact. Accordingly, a large resistance R between the stress free beam 14 and the input signal (RF IN in FIG. 2A) is assumed initially before any voltage is applied to the first and second sets of control pads 20, 24.

As shown in FIG. 4, the stress free beam 14 may be at any position within a gap between an upper control pad P6 of the second set of control pads 24 and a lower control pad P2 of the first set of control pads 20 before a voltage V is applied to any of the control pads 20, 24. When the voltage V is applied to the upper control pad P6 and the platforms 16, 18 are grounded, the stress free beam 14 is resultantly in a floating conductor state with a large contact resistance R between the platforms 16, 18 and the stress free beam 14. As shown in FIG. 5, the equivalent circuit of the MEMS switch 10 when the stress free beam 14 is in the floating conductor state is represented by two capacitors C1' and C2' connected in series. Positive charges Q gather at a surface S1 of the upper control pad P6 and an equal number of negative charges –Q gather at a surface S4 of the lower control pad P2. Because the stress free beam 14 is manufactured of a highly conductive material, it is a good conductor, and therefore a number of negative charges induced at the second lengthwise side 26 of the stress free beam 14 is equal to a number of positive charges induced at the first lengthwise side 22 of the stress free beam 14, and the net charge on the stress free beam 14 is accordingly zero.

Under an electrostatic condition, no current or movement of electric charges may flow inside the stress free beam 14. Accordingly, the electric fields tangential to the lengthwise sides of the stress free beam 14 are all zero. However, there is an electric field E1 between the upper control pad P6 and the stress free beam 14 and normal to the surface S1 of upper control pad P6 and the second lengthwise side 26 of the stress free beam 14. Also, there is a second electric field E2 between the stress free beam 14 and the lower control pad P2 and normal to the surface S4 of the control pad P6 and the first lengthwise side 22 of the stress free beam 14. The fringing effects of the electric fields at the ends of the upper and lower control pads P6, P2 are ignored for simplicity. Because the upper control pad P6 has a length L1 that is greater than a length L2 of the lower control pad P2, the electric field E1 is resultantly spread over a wider area than the electric field E2. Accordingly, the electric field E2 is stronger than the electric field E1.

A first resultant electrostatic force F1 equal to the total charges Q multiplied by the electric field E1 is present on the second lengthwise side 26 of the stress free beam 14. A second resultant electrostatic force F2 equal to the total charges –Q multiplied by the electric field E2 is present on the first lengthwise side 22 of the stress free beam 14. The first resultant force F1 is less than the second resultant force F2 because the first electric field E1 is less than the second electric field E2. Accordingly, the first resultant force F1 tends to pull the stress free beam 14 toward the upper control pad P6 while the force F2 tends to pull the stress free beam 14 toward the lower control pad P2. However, the net force (F2–F1) pulls the stress free beam 14 towards lower control pad P2, which results in the extended width portion 31 of the stress free beam 14 touching a surface C4 of the platform 16 to provide a good electrical contact between the extended width portion 31 of the stress free beam 14 and the surface C4 of the first platform 16. Depending on the net force (F2–F1), the electrical contact reduces the resistance R to a very small value so that the stress free beam 14 is at the same potential as the first platform 16. Simultaneously, although not shown in FIG. 6, the stress free beam 14 also is in contact with a surface C5 of the first output contact pad 28 and a surface C6 of the second platform 18.

Although not shown in the figures, negative charges –Q eventually accumulate at the stress free beam 14 and the electrostatic force F2 becomes zero. The electrostatic force F1 pulls the beam toward the upper control pad P6 until it is in contact with the surface C1 of the first platform 16 as shown in FIG. 6. Because the separation between the stress free beam 14 and the upper control pad P6 is very small, the charges at the upper control pad P6 and at the stress free beam 14 increase. The electric field E1 and hence the electrostatic force F1 is also stronger than before the initial contact. Simultaneously, the stress free beam 14 also is in contact with the second output contact pad 30 and the surface C3 of the second platform 18. The strong electrostatic force F1 creates good contacts at the upper surfaces C1, C3 of the first and second platforms 16, 18 and the second output contact pad 30. A conductive (or signal) path is established between the input signal RF IN through the first and second platforms 16, 18 and the stress free beam 14 to the second output contact pad 30.

Referring to FIG. 7, the equivalent circuit of the signal path is shown. R1 represents the contact resistance value at the surface C2 of the second output contact pad 30, and R2 and R3 represent the contact resistance values at the surfaces C1 and C3 of the first and second platforms 16, 18, respectively.

The voltage V may subsequently be applied to the lower control pad P2 to switch the MEMS switch 10. Electrostatic force resultantly pulls the beam toward the lower control pad P2 until the stress free beam 14 is in contact with the surfaces C4, C6 of the first and second platforms 16, 18 and the surface C5 of first output contact pad 28. Similarly, a conductive (signal) path is established between the input signal through the first and second platforms 16, 18 and the stress free beam 14 to the first output contact pad 28. Accordingly, the two output pads provide a single pole double throw (SPDT) switch.

In the above example, the voltage V was applied to either control pad P2 or control pad P6. However, the voltage V could have been applied to a different control pad of the second set of control pads 24 such as control pad P3 or to a different control pad of the first set of control pads 20 such as control pad P7. Further, the voltage V could have been applied to a plurality or all of the first set of control pads 20 or the second set of control pads 24. Regardless, the displacement of the stress free beam 14 depends on the relative potential or electrostatic force between opposing control pads.

While described above as a switch for an RF signal path, the MEMS switch 10 may also be utilized as an optical switch for blocking or permitting light transmission to thereby provide a light signal path. The substrate 12 is preferably transparent for this particular application. More particularly, when the stress free beam 14 is in contact with, for example, the second output contact pad 30, a light signal can be transmitted through the gap between the stress free beam 14 and the first output contact pad 28. This corresponds to the ON state. When the stress free beam 14 is in contact with the first output contact pad 28 the original gap disappears and total blockage of the light signal is possible. This corresponds to an OFF state.

Figure 2C:
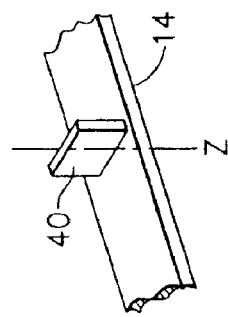
FIG. 2C is an exploded view of the portion B of the stress free beam according to another modification to the first preferred embodiment.
Figure 2B:
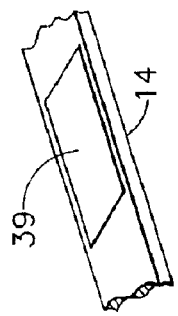
FIG. 2B is an exploded view of a portion B of the stress free beam according to a modification to the first preferred embodiment.

The MEMS switch 10 may also be modified to provide an optical switch for redirecting electromagnetic radiation such as a light or a laser according to first and second modifications discussed below. In a first modification to the MEMS switch 10, the stress free beam 14 includes a light reflecting layer 39 on its top surface as shown in FIG. 2B. However, the stress free beam 14 may alternatively include the light reflecting layer 39 on its bottom surface or both the top and bottom surfaces. Further, the light reflecting layer 39 does not necessarily cover the whole surface of the stress free beam 14. Rather, the light reflecting layer 39 may be broken into multiple sections on the surface. If the substrate 12 is transparent as mentioned above, the stress free beam 14 operates generally to permit a light signal to be transmitted through the substrate 12 when the stress free beam is in contact with the first output contact pad 28 or the second output contact pad 30. If the substrate 12 is absorbent, the light signal is absorbed by the substrate when the stress free beam is in contact with the first output contact pad 28 or the second output contact pad 30. The light reflective layer 39 of the stress free beam 14 reflects the light signal when the stress free beam 14 is in contact with the other of the first output contact pad 28 or the second output contact pad 30. This operation is similar to the optical switch discussed above for blocking or permitting light transmission except that in this first modification the light reflective layer 39 of the stress free beam 14 reflects the light signal when it is in the off state rather than merely blocking the light signal.

In a second modification, the MEMS switch 10 provides a light signal path that is angularly displaced. Referring to FIG. 2C, the MEMS switch 10 is modified to include a light reflecting mirror 40 on a top surface of the stress free beam 14. The light reflecting mirror 40 may be single or double-sided. The stress free beam 14 is angularly displaceable in accordance with the relative potential when the relative potential is between non-opposing control pads to displace a light signal in accordance with the angular displacement of the stress free beam. The stress free beam 14 is further laterally displaceable in accordance with the relative potential when the relative potential is between opposing control pads to displace the light signal perpendicularly to the stress free beam 14. More particularly, the stress free beam 14 can be displaced parallel to the center line A (corresponding to section line III—III shown in FIG. 2A) or rotated around the vertical axis Z (shown in FIG. 2C) depending on the activation voltage applied to the first and second sets of control pads 20, 24.

For example, when all of the control pads of the second set of control pads 24 are at the same voltage potential and the control pads of the first set of control pads 20 are at ground potential, the stress free beam 14 beam is displaced parallel to the center line A (corresponding to section line III–III). The light signal is resultantly redirected if it intercepts the light reflecting mirror 40 when the stress free beam 14 is in contact with one of the output contact pads 28, 30. No redirection occurs if the stress free beam 14 is in contact with the other of the output contact pads 28, 30. If control pads P1, P2, P6 and P8 are at the same voltage potential, the beam rotates around the vertical axis Z and the light signal is resultantly reflected at different angles from the light reflecting mirror 40 depending on the rotation of the stress free beam 14. In the second modification, each of the first set and second set of control pads 20, 24 includes at least two control pads. Also, multiple light reflecting mirrors similar to the light reflecting mirror 40 may be included on the stress free beam 14.

Figure 9:
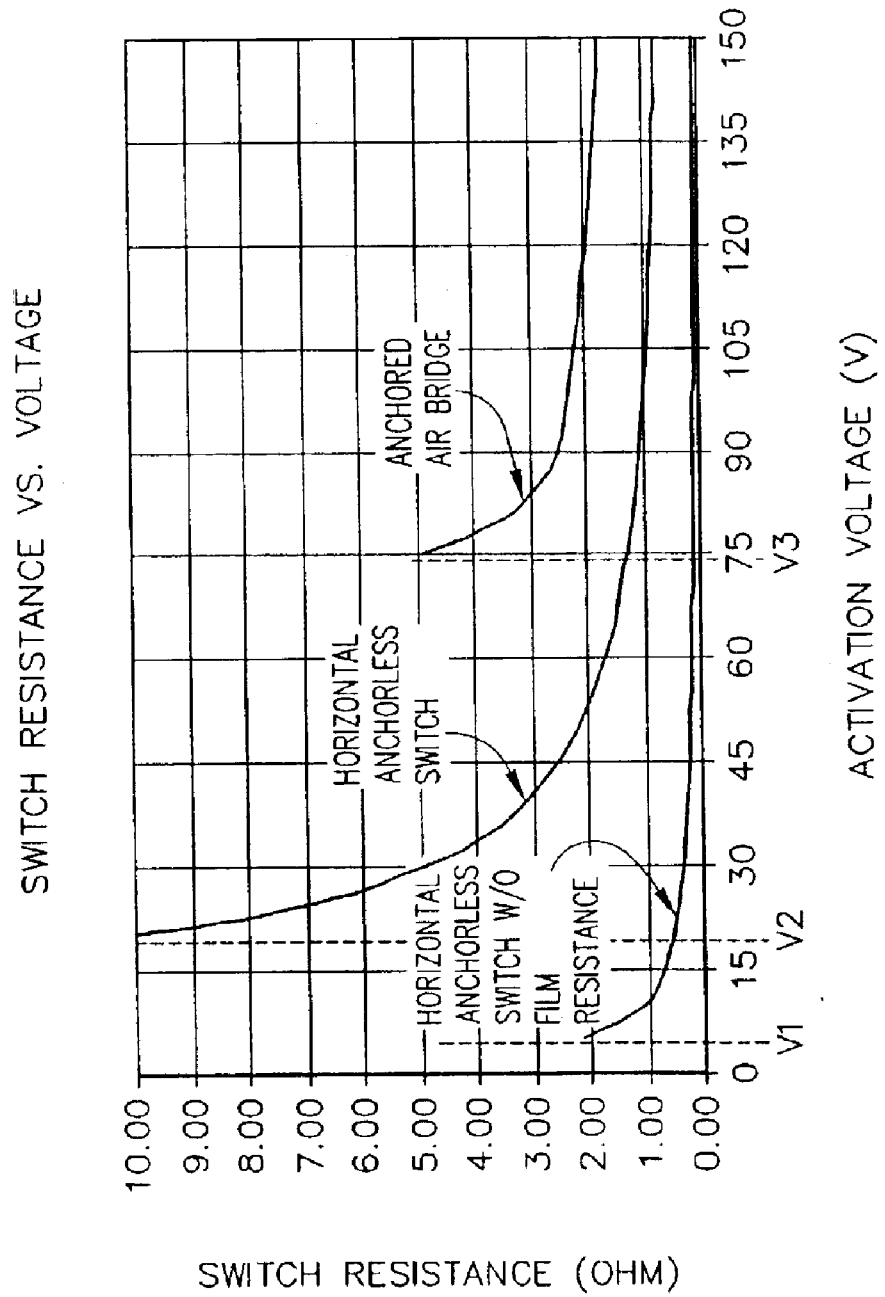
FIG. 9 is an illustration of the activation voltage vs. switch resistance achieved by the anchorless MEMS switch of FIG. 2A without film resistance between the contact surfaces, the anchorless MEMS switch of FIG. 2A with film resistance between the contact surfaces and an anchored air bridge MEMS switch.

FIG. 9 shows a comparison of activation voltage vs. switch resistance achieved by the MEMS switch 10 with activation voltage vs. switch resistance achieved by a conventional anchor bridge switch. Both switches have similar layouts and are formed from similar materials with the same surface resistivity. The curve for the MEMS switch 10 was obtained from data simulated using custom designed electromechanical software while the anchored air bridge curve was derived using actual data. As shown from this curve, the activation voltage V2 required for the switch to have contact is much lower for the MEMS switch 10 than the activation voltage V3 of the anchored air bridge. Further, if the surface film resistance is ignored, a much smaller contact resistance (from the third curve) can be achieved using the MEMS switch 10 at a much lower activation voltage V1.

Figure 10A:
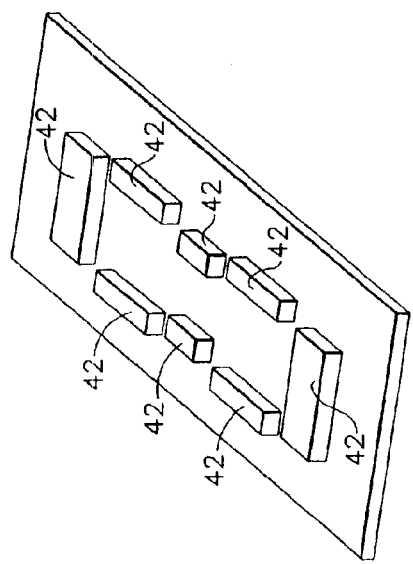
FIGS. 10A–10E illustrate a fabrication process for fabricating the MEMS switch shown in FIG. 1.
Figure 10B:
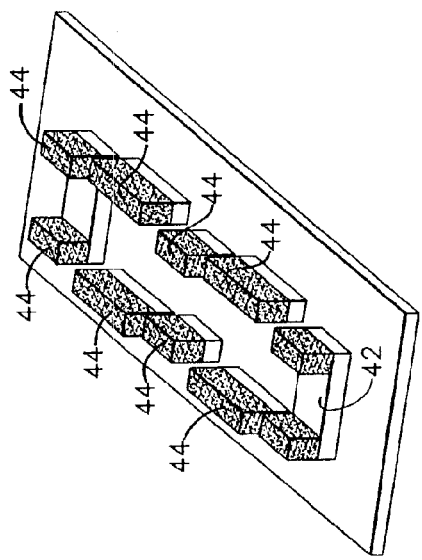
Figure 10C:
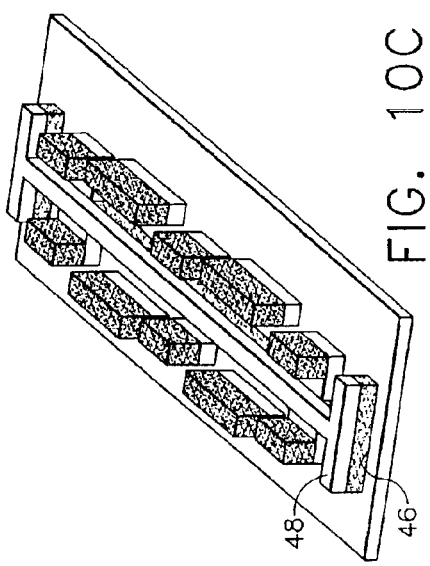
Figure 10E:
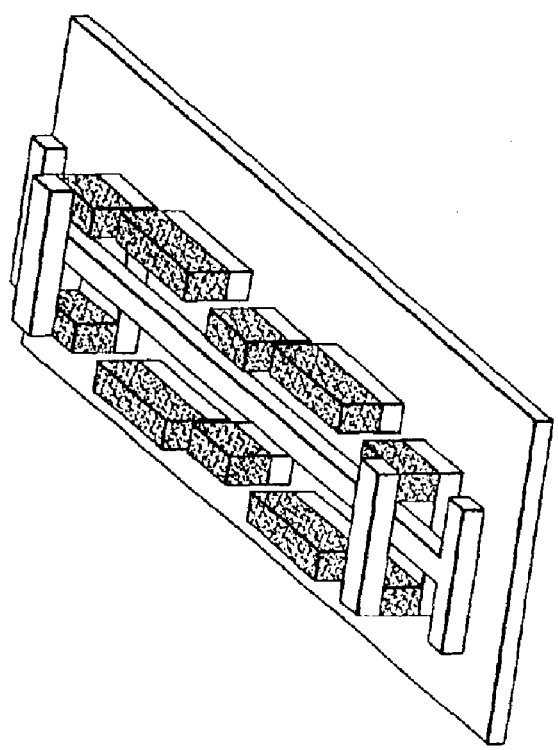
Figure 10D:
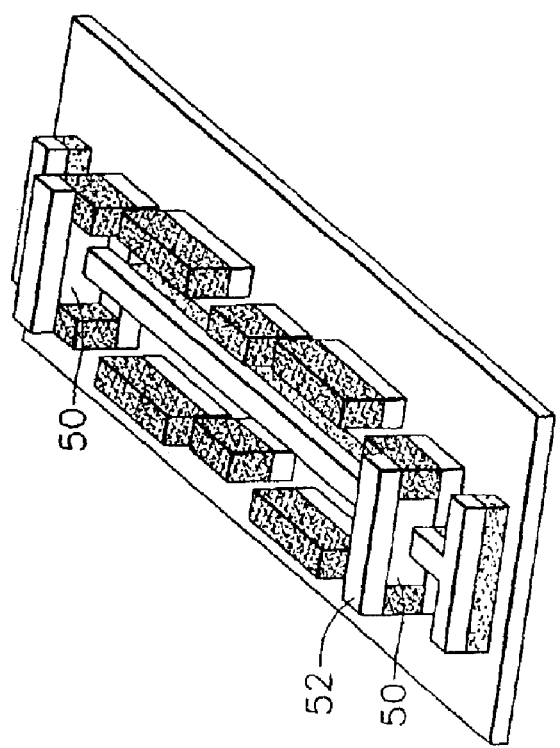

Referring to FIGS. 10A–10E, an exemplary method of fabrication of the MEMS switch 10 will be discussed. As shown in FIG. 10A, initially a first level metal 42 is deposited on the substrate 12 using a first mask (not shown). As shown in FIG. 10B, contact and electrode metal 44 is deposited on the first level metal 42 using a second mask (not shown). As shown in FIG. 10C, a first sacrificial layer 46 and the conductive material 48 for forming the stress-free beam 14 are deposited by using a third mask. As shown in FIG. 10D, a second sacrificial layer 50 and material for the latch 52 are deposited by using fourth and fifth masks (not shown). Finally, as shown in FIG. 10E, the first and second sacrificial layers 46, 50 are removed to produce the MEMS switch 10. Fabrication of the MEMS switch 10 is substantially equal in complexity to an industrial IC fabrication process. Further, the flexibility in substrate selection allows the MEMS switch 10 to be integrated relatively easily with the rest of the IC. The fabrication process also includes fewer fabrication steps than the number required to fabricate the vertically moving MEMS switch.

Figure 11:
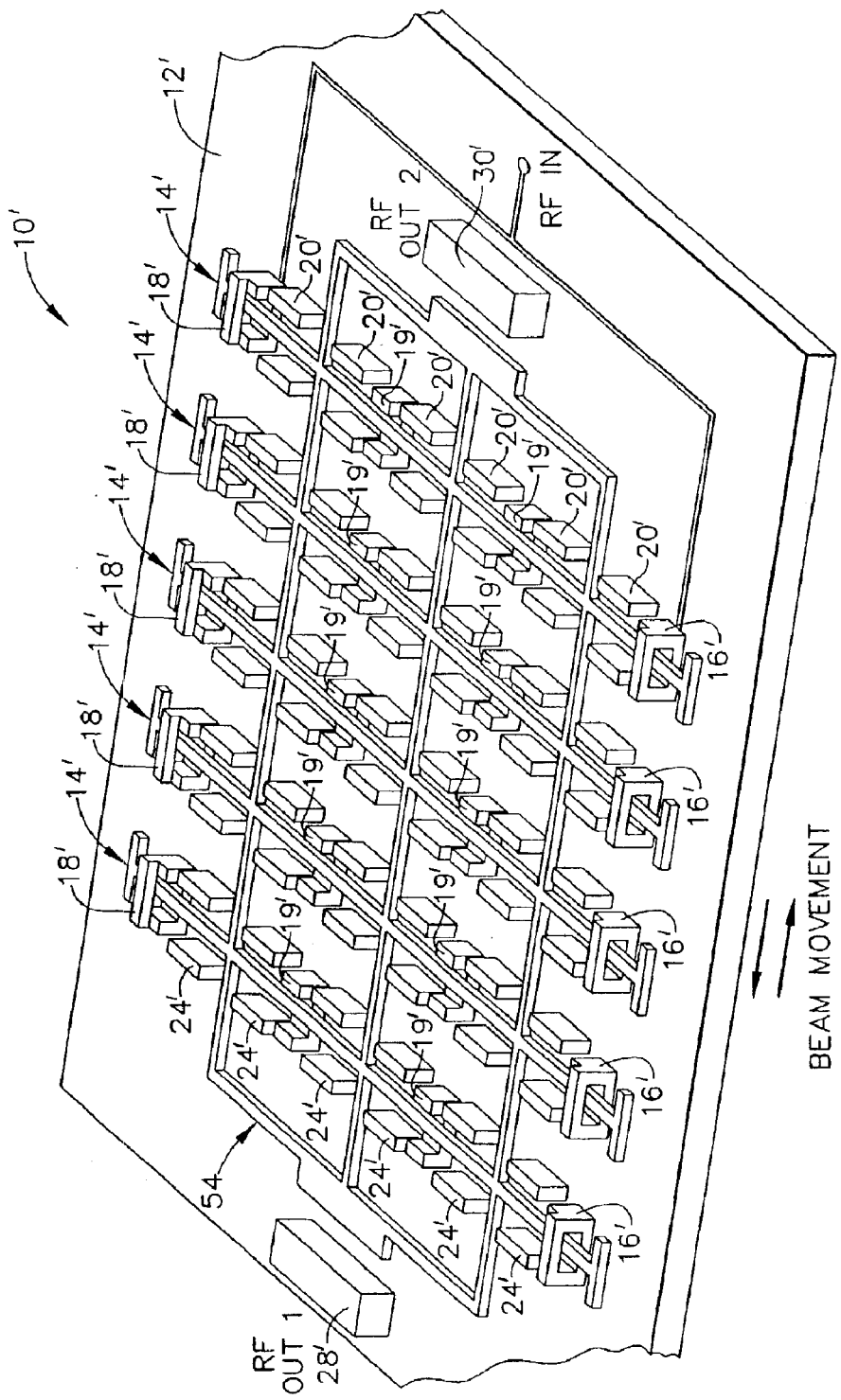
FIG. 11 is an isometric view of an exemplary MEMS switch according to a second preferred embodiment.

Referring to FIG. 11, a MEMS switch 10' according to a second embodiment will be discussed in which similar parts of the MEMS switch 10 of the first embodiment have the same reference numerals. The MEMS switch 10' includes a primary stress free beam 54 disposed above a substrate 12' for controlling signal flow. The primary stress free beam 54 is displaceable in directions substantially parallel to the substrate 12' to selectively make and break electrical contact with first and second output contact pads 28', 30' disposed on the substrate 12'. The primary stress free beam 54 preferably has a frame structure. The MEMS switch 10' also includes a plurality of secondary stress free beams 14' structurally and electrically coupled to the primary stress free beam 54. Each of the plurality of secondary stress free beams 14' is disposed within first, second and third platforms 16', 18', 19' for limiting displacement of the each of the plurality of secondary stress free beams 14' in directions other than substantially parallel to the substrate 12' and is disposed between first and second sets of control pads 20', 24' on the substrate 12'. The first and second sets of control pads 20', 24' are for providing the relative potential. The first, second and third platforms 16', 18', 19' are electrically connected (not shown for 19' for purpose of ease of illustration) to each other to reduce overall switch contact resistance.

Each of the plurality of secondary stress free beams 14' is responsive to a relative potential to make and break electrical contact with the sidewalls of first, second and third platforms 16', 18', 19' disposed on the substrate 12' according to the relative potential. The third platforms 19' and the first and second platforms 16', 18' prevent each of the secondary stress free beams 14' from contacting its respective control pads 20', 24'. More particularly, if each of the plurality of secondary stress free beams 14' is identical to the stress free beam 14 of the first embodiment, the extended width portions (not shown) prevent the secondary stress free beams 14' from contacting their respective control pads.

Also, the first and second output contact pads 28', 30' as well as the primary stress free beam 54 may be eliminated by assembling a plurality of the switches shown in FIG. 1 in series. In such an arrangement, each stress free beam 14 has output contact pads 28, 30 as shown in FIG. 1. Generally, the above embodiment of a switch with multiple beams provides a switch array of m×n individual switches that can be electrically connected to each other in parallel or in series. The stress free beams 14 of all the switches 10 in the same row can be combined as one single stress free beam similar to the secondary stress free beam 14' in switch 10' in FIG. 11. A multiple pole multiple throw MEMS switch can be configured using a combination of two or more MEMS switches (10 or 10').

In operation, one of the plurality of secondary stress free beams 14' may receive an input signal such as an RF signal via its first, second and third platforms 16', 18', 19' similar to the manner by which the stress free beam 14 received an input signal via its platforms 16, 18 as discussed above with respect to FIG. 2A. Because all of the plurality of secondary stress free beams 14' are electrically coupled to the primary stress free beam 54, the signal is transmitted from the secondary stress free beam 14' to the primary stress free beam 54. A voltage is applied by, for example, the second set of control pads 24' of each of the secondary stress free beams 14' to displace them towards the sidewalls of the first, second and third platforms 16', 18', 19'. Because the plurality of secondary stress free beams 14' are structurally and electrically coupled to the primary stress free beam 54, the displacement of the plurality of secondary stress free beams 14' accordingly displaces the primary stress free beam 54 until it contacts the second output contact pad 28' and the sidewalls of the first, second and third platforms 16', 18', 19' simultaneously.

Thus, a signal path is provided between the secondary stress free beams 14', the primary stress free beam 54 and the output contact pad 28'. Because the primary stress free beam 54 is displaced by the combined displacement of the secondary stress free beams 14', more contact force is accumulated by the primary stress free beam 54 for the same activation voltage and lateral displacement as the MEMS switch 10. Further, a lower activation voltage is required to activate MEMS switch 10' for the same contact force and lateral displacement as the MEMS switch 10. Also, more lateral displacement can be achieved in MEMS switch 10' for the same contact force and activation voltage as the MEMS switch 10. Generally, the MEMS switch 10' permits greater design flexibility as discussed later.

In summary, the MEMS switch 10 includes an anchorless stress free beam 14 that is freely displaceable in lateral directions. This anchorless stress free beam 14 achieves numerous advantages in comparison to conventional anchored beam structures.

Specifically, there is substantially no stress in the stress free beam 14 during operation and fabrication because it is freely moving. Further, there is substantially no metal fatigue and eventual plastic deformation resulting from repeated bending as in anchored switch structures. The reduced metal fatigue, plastic deformation, operational stress and fabrication stress result in a switch structure that is more reliable and longer lasting than the conventional anchored switches.

The MEMS switch 10 has zero power consumption while switching and maintaining the stress free beam 14 in certain positions as well as a low activation voltage because the electrostatic force is only required to overcome the negligible adhesion forces at two ends of the stress free beam 14 and the air resistance in moving the stress free beam 14.

A large contact force maintains the stress free beam 14 at certain positions because most of the electrostatic force is used for contact rather than for bending or deflecting a structure with fixed anchors. The large contact force also guarantees large contact areas and accordingly reduces the contact resistances. As a result of small contact resistances, larger current can pass through the contact without excessively heating up and hence destroying the contact regions.

Further, the MEMS switch 10 may achieve a switching time in the order of sub psec because the gravitational force of the stress free beam (nN) is negligible in comparison with the electrostatic force (tens to hundreds of $\mu$N).

The MEMS switch 10 also permits greater design flexibility. More particularly, a wide range of materials and beam shapes can be used for the beam with different surface hardness and beam rigidities for achieving the optimum design for different applications. Conventional anchored beam structures are limited to certain materials and beam shapes because of the bending requirement. Further, proper selection of beam material and surface hardness can minimize stiction problems during contact. The opposing voltages provide separation force to separate the contact in case of stiction.

The MEMS switch 10 does not require a beam with elongated geometry for providing bending flexibility. Therefore, a very compact switch is possible, and the switch layout design is more flexible to optimize the RF performance and improve isolation when the MEMS switch 10 is in the OFF state.

The MEMS switch 10' offers further unique advantages. The switch contact force can be increased by increasing the array size of switch 10' for the same amount of lateral displacement and activation voltage to achieve low contact resistance and high power handling. The beam lateral displacement can be increased by increasing the array size of switch 10' for the same amount of contact force and activation voltage to achieve more input and output separation and hence more RF signal isolation between the input and output. The switch activation voltage may also be reduced by increasing the array size of switch 10' for the same amount of contact force and lateral displacement to thereby offer wider commercial application insertion opportunities. The switch 10' has even more design flexibility in optimizing the contact material for a wider range of contact forces. The plurality of secondary stress free beams 14' of the switch 10' provide an accumulated force that serves as a self repair mechanism for eliminating stiction problems between one or more of the secondary stress free beams 14' and a contact site at the first, second and/or third platforms 16', 18', 19'.

While the above description is of the preferred embodiment of the present invention, it should be appreciated that the invention may be modified, altered, or varied without deviating from the scope and fair meaning of the following claims.

What is claimed is:

1. A micro electromechanical system switch comprising:
   a substrate:
   a stress free beam disposed above the substrate and provided within first and second platforms, the first and second platforms being disposed on the substrate to limit displacement of the stress free beam in directions that are not substantially parallel to the substrate; and
   a set of one or more control pads disposed in a vicinity of a first lengthwise side of the stress free beam, for creating a potential on the first lengthwise side of the stress free beam,
   wherein,
   the stress free beam is displaceable in directions substantially parallel to the substrate in accordance with the potential for providing a signal path, and
   the first and second platforms are further for receiving an input signal.

2. The micro electromechanical system switch of claim 1, further comprising:
   at least one additional stress free beam substantially identical to the stress free beam; and
   a primary stress free beam structurally and electrically coupled to the stress free beam and the at least one additional stress free beam;
   wherein the primary stress free beam is displaceable in the directions substantially parallel to the substrate for providing the signal path as a result of the displacement of the at least one additional stress free beam and the stress free beam.

3. The micro electromechanical system switch of claim 1, further comprising an output contact pad disposed on the substrate and in the vicinity of the first lengthwise side of the stress free beam, wherein the output contact pad is for becoming electrically coupled to the stress free beam to thereby provide the signal path between the output contact pad, the stress free beam and the first and second platforms when the potential is created by the one or more control pads.

4. The micro electromechanical system switch of claim 3, further comprising:
   another set of one or more control pads disposed on the substrate and in a vicinity of a second lengthwise side of the stress free beam, for creating another potential on the second lengthwise side of the stress free beam; and
   another output contact pad disposed on the substrate and in the vicinity of the second lengthwise side of the stress free beam.

5. The micro electromechanical system switch of claim 4, wherein:
   the set of one or more control pads and the another set of one or more control pads are further for creating a relative potential between the first and second lengthwise sides of the stress free beam that is based on a difference between the potential and the another potential; and
   the stress free beam is displaced either to the output contact pad and maintains contact therewith or to the another output contact pad and maintains contact therewith when the relative potential is greater than or equal to a threshold potential.

6. The micro electromechanical system switch of claim 5, wherein:
   the substrate is transparent; and
   the stress free beam is further for permitting a light signal to be transmitted through the substrate when the stress free beam is in contact with a first of the output contact pad or the another output contact pad and is for blocking the light signal when the stress free beam is in contact with a second of the output contact pad or the another output contact pad.

7. The micro electromechanical system switch of claim 5, wherein the stress free beam includes a light reflective layer on a top surface thereof for reflecting a light signal when the stress free beam is in contact with a first of the output contact pad or the another contact output pad and for permitting the light signal to be absorbed by the substrate when the stress free beam is in contact with a second of the output contact pad or the another output contact pad.

8. The micro electromechanical system switch of claim 5, wherein:

the stress free beam includes a light reflecting mirror;

each of the set of one or more control pads and the another set of one or more control pads comprises at least two control pads, the at least two control pads of the set of one or more control pads respectively oppose the at least two control pads of the another set of one or more control pads;

the stress free beam is angularly displaceable in accordance with the relative potential when the relative potential is between non-opposing control pads to displace a light signal in accordance with the angular displacement of the stress free beam; and the stress free beam is further laterally displaceable in accordance with the relative potential when the relative potential is between opposing control pads to displace the light signal perpendicularly to the stress free beam.

9. The micro electromechanical system switch of claim 3, wherein the stress free beam comprises extended width portions within the first and second platforms and opposing the output contact pad, respectively for preventing the stress free beam from becoming substantially electrically coupled to the set of one or more control pads and the another set of one or more control pads.

10. The micro electromechanical system switch of claim 1, wherein each of the first and second platforms comprises an extended sidewall for restricting horizontal displacement of the stress free beam.

11. The micro electromechanical system switch of claim 10, wherein the each of the first and second platforms further comprises a beam latch for substantially preventing vertical displacement of the stress free beam.

12. A micro electromechanical system switch comprising:

a stress free beam disposed above a substrate and responsive to a relative potential for controlling a signal flow, wherein the stress free beam is displaceable in directions substantially parallel to the substrate to selectively make and break electrical contact with an output contact pad disposed on the substrate according to the relative potential; and first and second platforms disposed on the substrate for limiting displacement of the stress free beam in directions other than substantially parallel to the substrate, wherein each of the first and second platforms comprises a beam latch for substantially preventing vertical displacement of the stress free beam and an extended sidewall for restricting horizontal displacement of the stress free beam.

13. The micro electromechanical system switch of claim 12, wherein the stress free beam further comprises a light reflective layer for reflecting a light signal based upon the relative potential.

14. The micro electromechanical system switch of claim 12, wherein:

the substrate is transparent for permitting passage of a light signal; and the stress free beam is further for reflecting the light signal based upon the relative potential.

15. The micro electromechanical system switch of claim 12, further comprising first and second control pads disposed on the substrate for providing the relative potential.

16. The micro electromechanical system switch of claim 15, wherein the stress free beam has different widths in the lengthwise direction for restricting displacement and for preventing contact with the first and second control pads.

17. The micro electromechanical system switch of claim 15, further comprising another output contact pad disposed on the substrate, wherein the stress free beam is further displaceable in the directions substantially parallel to the substrate to selectively make and break electrical contact with the output contact pad or the another output contact pad according to the relative potential.

* * * * *